United States Patent
Calvert (10) Patent No.: US 8,838,194 B2
(45) Date of Patent: Sep. 16, 2014

(54) JOINTS WITH VERY LOW RESISTANCE BETWEEN SUPERCONDUCTING WIRES AND METHODS FOR MAKING SUCH JOINTS

(75) Inventor: Simon James Calvert, Kidlington (GB)

(73) Assignee: Siemens PLC, Camberley (GB)

( * ) Notice: Subject to any disclaimer, the term of this patent is extended or adjusted under 35 U.S.C. 154(b) by 0 days.

(21) Appl. No.: 13/984,225

(22) PCT Filed: Dec. 9, 2011

(86) PCT No.: PCT/GB2011/052448
§ 371 (c)(1),
(2), (4) Date: Oct. 7, 2013

(87) PCT Pub. No.: WO2012/107709
PCT Pub. Date: Aug. 16, 2012

(65) Prior Publication Data
US 2014/0038828 A1    Feb. 6, 2014

(30) Foreign Application Priority Data
Feb. 8, 2011 (GB) .................................. 1102153.2

(51) Int. Cl.
*H01L 39/24* (2006.01)
*H01L 39/02* (2006.01)
*H01L 39/14* (2006.01)

(52) U.S. Cl.
CPC .............. *H01L 39/141* (2013.01); *H01L 39/02* (2013.01)
USPC ........................................................ 505/231

(58) Field of Classification Search
USPC ........................................................ 505/231
See application file for complete search history.

(56) References Cited

U.S. PATENT DOCUMENTS

| 4,584,547 A | 4/1986 | Thornton |
| 4,713,878 A | 12/1987 | Kumpitsch et al. |
| 2006/0240991 A1 | 10/2006 | Takahashi et al. |
| 2007/0194870 A1* | 8/2007 | Takahashi et al. ............ 335/216 |
| 2009/0298696 A1* | 12/2009 | Otto et al. ..................... 505/230 |

FOREIGN PATENT DOCUMENTS

| EP | 0148479 | 7/1985 |
| JP | 2276180 | 11/1990 |
| JP | 65345 | 1/1994 |
| JP | 10106647 | 4/1998 |
| JP | 3208279 | 7/2001 |
| JP | 4033272 | 1/2008 |
| JP | 5074508 | 11/2012 |

* cited by examiner

*Primary Examiner* — Paul Wartalowicz
(74) *Attorney, Agent, or Firm* — Schiff Hardin LLP (57) ABSTRACT

In a method or joint for joining first and second semiconductor wires, each comprising a number of filaments which each comprise a superconductive core within a respective sheath, the filaments being embedded within a matrix and wherein the superconductive cores comprise magnesium diboride and the sheaths comprise niobium, over a certain length a matrix is removed to expose the filaments. The exposed filaments are immersed in molten tin such that the niobium of the sheaths is converted to niobium-tin throughout a thickness of the sheaths. A superconductive path is provided between the superconductive cores of filaments of the first wire through the niobium-tin sheaths of the filaments to the superconductive cores of the second wire.

7 Claims, 6 Drawing Sheets

JOINTS WITH VERY LOW RESISTANCE BETWEEN SUPERCONDUCTING WIRES AND METHODS FOR MAKING SUCH JOINTS

BACKGROUND

The present application relates to methods for joining superconducting wires together, and joints as may be made by such methods.

When manufacturing equipment such as electromagnets from superconducting wire, it is commonly required to join separate lengths of wire together. In order to maintain the superconductivity of the equipment, the joints must also be superconducting, or at least exhibit very low resistance, if operation in 'persistent-mode' is required. Typically, joint resistances of $\sim 10^{-13}$ ohms are required to enable this mode of operation. Operation in 'persistent mode' is highly desirable as this enables the power supply to be dispensed with after initial energization has been achieved.

Recent developments in superconducting materials have led to the use of magnesium diboride $MgB_2$ as a superconducting material. Magnesium diboride $MgB_2$ has the benefit of exhibiting superconductivity at higher temperatures than more conventional materials, avoiding the need to cool the superconductor to very low temperatures. However, the material itself is brittle, and difficult to join to form persistent joints.

Figure 1:
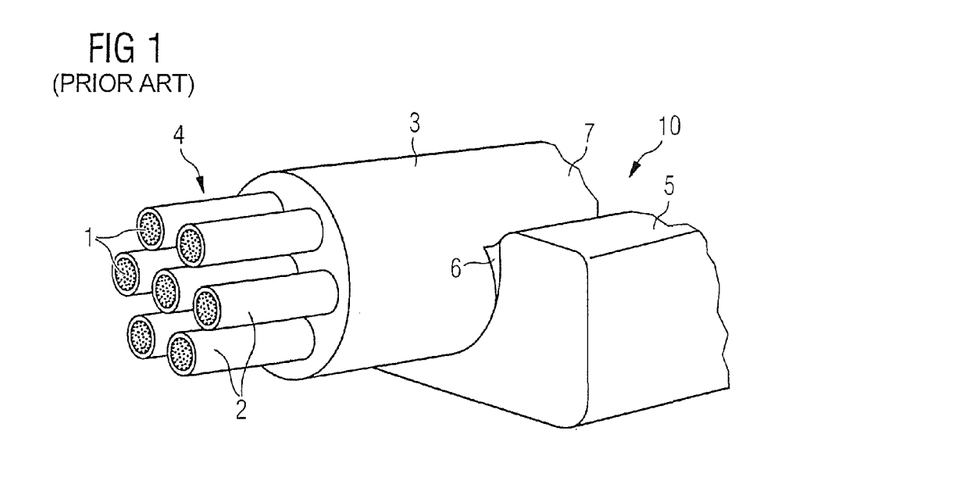
FIG. 1 shows a cut-away view of a typical niobium-sheathed, $MgB_2$-cored superconducting conductor.

FIG. 1 shows a cut-away view of a typical $MgB_2$-core superconducting conductor 10. Superconducting filaments 4 comprise an $MgB_2$ core 1 in an essentially granular, powder form, held within sheaths 2 of niobium metal. These $MgB_2$-filled niobium sheaths are further encased in a matrix 3 of high strength, conductive metal or alloy, such as the Cu—Ni alloy known as "MONEL". The matrix 3 and filaments 4 make up superconducting wire 7. The purpose of the niobium 2 is to prevent unwanted reactions occurring between the $MgB_2$ and matrix material during wire manufacture.

In one manufacturing method, known as the ex-situ process, granulated or powdered $MgB_2$ is placed in a number of niobium lined holes drilled into a billet of matrix material. The complete billet is then drawn to the required final wire diameter. The Niobium-cased superconducting filaments are formed and compacted during the drawing process.

The matrix 3 provides an electrically conductive shunt and thermal sink. Should any of the superconducting filaments 4 quench, then heat will be carried away from the quenched region by the matrix 3, and electric current will flow through the lower resistance offered by the matrix. This will allow the quenched part of the filament to cool back to superconducting condition. The matrix also makes the superconducting wire more mechanically robust.

The conductor 10 typically also comprises a stabilizing channel 5. This may be of copper or another material, or combination of materials. The channels should be electrically and thermally conductive. In the illustrated example, the wire 7 is soldered at 6 into a cavity of the channel 5. The channel 5 adds further electrical and thermal stability, and mechanical robustness, to the superconducting wire 7, in the same manner as explained with reference to matrix 3.

In order to make a superconducting joint, two conventional approaches have been adopted: firstly, a joint may be formed directly between the $MgB_2$ cores 1 of the wires to be joined. Alternatively, another material, which is also superconducting at the temperature of operation of the wire, is used to electrically join the $MgB_2$ cores 1 of the wires together in a superconducting arrangement. Typically, known joining methods involve exposing the $MgB_2$ cores of the superconducting wires to be joined, and mechanically pressing the exposed $MgB_2$ particles of the respective wires together to form the superconducting joint. In some known arrangements, an intermediate layer of a superconducting material, typically a metal such as indium is interposed between the exposed cores of the respective wires, to increase the contact surface area and improve mechanical adhesion between the particles of the respective wires. Such methods require significant mechanical loads to be applied to the $MgB_2$ particles. The $MgB_2$ particles are relatively brittle, and applying such significant mechanical loads risks fracturing the $MgB_2$ superconducting material, leading to failures of the superconducting joint.

In some known methods, $MgB_2$ particles are exposed and heated, for example when joined by $MgB_2$ powder or a reaction between magnesium and boron powders. If the $MgB_2$ particles are exposed, there is a risk of oxidation. Failures may occur sometime after the jointing process, after the joint is built in to a superconducting device, such as a magnet within a cryogen vessel. Such failures are very expensive and time-consuming to repair, due to the access problems of reaching a joint within a superconducting device built into a cryogen vessel, and/or vacuum vessel, and so on. It is therefore an object to provide methods for joining $MgB_2$-cored superconducting wires which reduce the risk of mechanical damage, or oxidation, to the $MgB_2$ particles.

However, tests on conventional joints between $MgB_2$-based superconducting wires have shown magnetic field tolerance values poorer than expected. This is believed to be due to conduction actually taking place through the niobium of the sheaths 2 rather than through the superconducting joints between $MgB_2$ particles of the respective wires. Niobium is a "Type II" superconductor, but has a very low upper critical magnetic field strength $B_{c2}$ when compared to other Type II superconductors such as the alloy niobium titanium. The critical field of niobium is in the range of a few tenths of a tesla with exact value depending on many factors, most notably the current density. Since it is highly desirable that joints for use in superconducting magnets should be able to tolerate quite high magnetic fields, any jointing method that utilizes the niobium sheaths for current transport is likely to be of little use.

Certain conventional methods for producing superconducting joints are described in WO2007/128635A1, US2008/0236869A1, U.S. Pat. No. 6,921,865B2 and U.S. Pat. No. 7,152,302B2.

SUMMARY

It is an object to produce superconducting joints between niobium-sheathed superconducting wires, such as those with a $MgB_2$-core, or those with a NbTi core.

In a method or joint for joining first and second semiconductor wires, each comprising a number of filaments which each comprise a superconductive core within a respective sheath, the filaments being embedded within a matrix and wherein the superconductive cores comprise magnesium diboride and the sheaths comprise niobium, over a certain length a matrix is removed to expose the filaments. The exposed filaments are immersed in molten tin such that the nobium of the sheaths is converted to niobium-tin throughout a thickness of the sheaths. A superconductive path is provided between the superconductive cores of filaments of the first wire through the niobium-tin sheaths of the filaments to the superconductive cores of the second wire.

The above and further objects, characteristics and advantages of the present exemplary embodiments will become more apparent from the following description of those certain embodiments of the present invention, in conjunction with the accompanying drawings.

DESCRIPTION OF EXEMPLARY EMBODIMENTS

For the purpose of promoting an understanding of the principles of the invention, reference will now be made to preferred exemplary embodiments/best mode illustrated in the drawings and specific language will be used to describe the same. It will nevertheless be understood that no limitation of the scope of the invention is thereby intended, and such alterations and further modifications in the illustrated embodiments and such further applications of the principles of the invention as illustrated as would normally occur to one skilled in the art to which the invention relates are included herein.

The present exemplary embodiment provides methods for joining niobium-sheathed superconducting wires and joints such as may be prepared by such methods.

According to the exemplary embodiment, the niobium-sheathed superconducting filaments 4 are immersed in liquid tin (Sn), so that the niobium sheath reacts with the tin to form $Nb_3Sn$. Conventionally, $Nb_3Sn$ superconductor filaments have been prepared by diffusion of tin into filaments of niobium during a long, high temperature, reaction process. A similar process is employed for jointing niobium-sheathed wires according to the exemplary embodiment.

The $Nb_3Sn$ is a superconductor having a much higher field tolerance (~18 T at 4K) than niobium (~0.5 T at 4K), and a high critical temperature Tc of about 18K. $Nb_3Sn$ also has a large coherence length, which enables lossless current transfer between the reacted sheath and the $MgB_2$ superconductor granules or powder. The coherence length indicates the size of gap which may exist between superconductors, yet superconductivity to still exist between them. By having a sheath material such as $Nb_3Sn$ with a large coherence length, superconductivity may be maintained between the sheath material and enclosed grains of $MgB_2$. Thus, if the niobium sheath in superconducting wires can be converted to $Nb_3Sn$, the field tolerance of the joint should increase substantially and the transport current between the grains of $MgB_2$ and the sheath material should be improved.

In known methods of joining $MgB_2$ cored wires, it is believed that the majority of electric current passes through the sheath material, rather than directly from the core of one wire to the core of the other. The exemplary embodiment provides a particularly advantageous sheath material to enable such current transfer to operate more effectively.

The reacted sheaths 2 of filaments 4 are joined by superconducting materials. The exemplary embodiment avoids the need to expose $MgB_2$ grains and to make mechanical joints between them. It is believed that exposure of $MgB_2$ to hot tin will result in the formation of undesired compounds as contaminants. This will degrade the attainable quality of the junction.

Joints according to the exemplary embodiment have a relatively high field tolerance, and a relatively high critical temperature Tc. Joints formed according to the methods of the present exemplary embodiment are believed to provide good electrical and mechanical connectivity between the superconducting filaments of the joined wires, improved magnetic field tolerance of the joints as compared to conventional joints between similar wires, and protection against mechanical damage.

Figure 2:
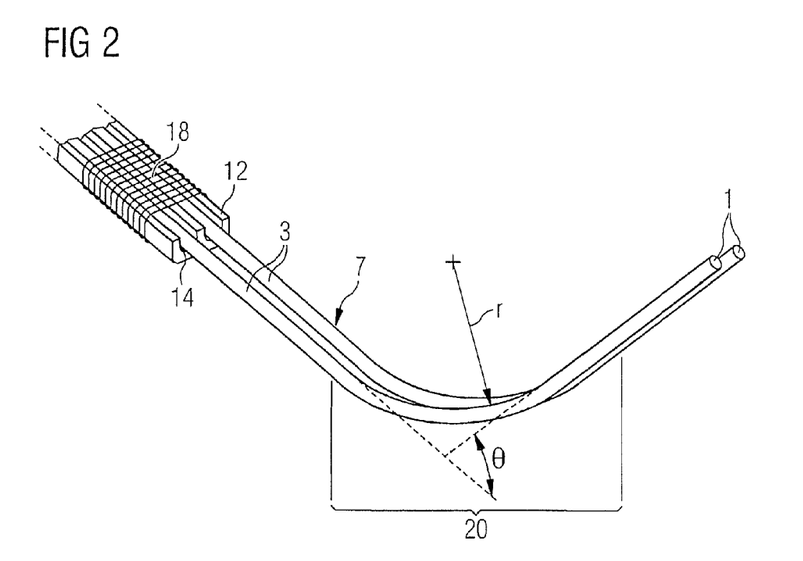
FIG. 2 shows two superconducting wires at an early stage in a joining method of the exemplary embodiment.

FIG. 2 illustrates an early step in a joining method of the present exemplary embodiment. Two conductors 12, 14 to be joined are stripped of their channel 5 over a certain length to expose the wires 7. A binding 18, for example of stainless steel wire, is wrapped around the two conductors in an unstripped region, to hold them mechanically together. The channels 5 of the conductors 12, 14 may be soldered together in the unstripped region for further mechanical stability. A certain length 20 of each of the stripped regions of the wires 7 is bent to a radius r. The radius should be selected to be small, yet not so small as to risk degradation of the $MgB_2$ superconductor. With present $MgB_2$ wires, a radius of about 80 mm-100 mm may be preferred. The bend may be made to an angle θ preferably in the range 45°-90°.

Figure 3:
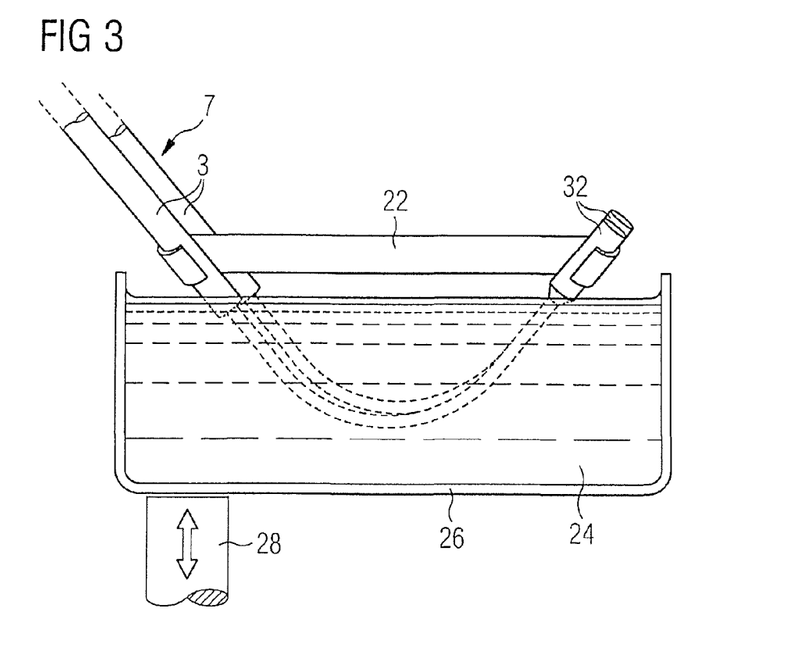
FIG. 3 shows the wires of FIG. 2 undergoing a later step in the joining method of the exemplary embodiment.

FIG. 3 shows a next stage in a method of the present exemplary embodiment, a retaining clip 22 is applied, to hold the bent portion 20 of wires 7 steady in position. The stripped wires 7 in the bent region are immersed in an etchant 24 within a bath 26. The material and temperature of the etchant is selected with regard to the materials and the topology involved. The etchant is selected to remove the matrix 3 material, and to expose the sheaths 2 of the filaments 4.

In a typical example, the matrix 3 is of copper alloy, and the sheaths 2 are of niobium. An etchant 24 of nitric acid may be found suitable, as it etches copper but does not significantly attack niobium.

In other examples, molten tin (Sn) at a temperature of approximately 300° C. may be found suitable. Cu and copper alloys dissolve readily in hot tin. In this case, the tin will simultaneously etch the copper matrix and form NbSn in a single step.

Use of hot tin is preferred, and acid etch is preferably used only for sheath materials which are not significantly reactive with hot tin or where the removal of the sheath material with tin would take too long.

Bath 26 must be chosen to be resistant to the etchant 24. In the case of a hot tin etchant, the bath may be a crucible. An agitator 28 may be provided to cause circulation of the etchant 24 around and between the wires 7, and the sheathed 2 filaments 4.

Once etching is complete, reaction of the sheath 2 material is carried out. In a crucible, which may be a crucible bath as used in the step of FIG. 3, the bent region 20 is immersed in hot tin (Sn) at a temperature of about 600° C. The elemental niobium (Nb) of the sheath 2 reacts with the hot tin (Sn) by diffusion to become $Nb_3Sn$, a superconductor. The rate of diffusion of Sn into Nb is highly dependent on the temperature of the molten Sn. Accordingly, the highest practicable temperature for the tin is preferred. An inert gas or vacuum atmosphere may be provided to prevent oxidation of the tin.

Figure 4A:
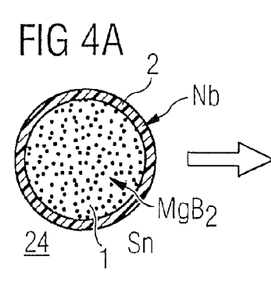
FIGS. 4A-4C show cross sections of a niobium-sheathed, $MgB_2$-cored superconducting filament at various stages in a joining method of the exemplary embodiment.
Figure 4B:
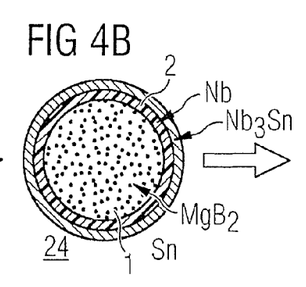
Figure 4C:
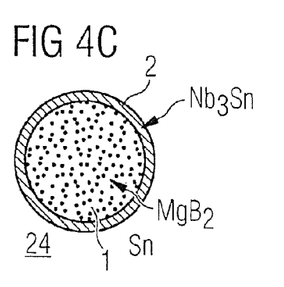

FIGS. 4A-4C shows three cross-sectional views, each through a single sheathed 2 filament 4 illustrating progression of the reaction. In FIG. 4A, the $MgB_2$ core 1 is enclosed within an unreacted Nb sheath 2, immersed in the Sn bath 24. In FIG. 4B, the sheath 2 has begun to react, and an outer part of the sheath has transformed into $Nb_3Sn$, while the inner part of the sheath remains as elemental Nb. Reaction continues by diffusion, until the sheath 2 is completely transformed into $Nb_3Sn$, as shown in FIG. 4C. The $MgB_2$ core 1 remains un-reacted.

Figure 5:
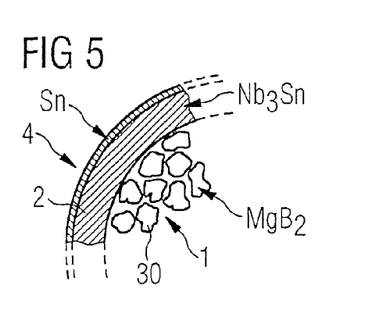
FIG. 5 shows an enlarged partial view of FIG. 4C.

The wires 7 are then removed from the crucible. FIG. 5 shows a partial cross-section of a single filament 4 following this step. The $MgB_2$ core 1 is unreacted. The sheath 2 is now entirely of $Nb_3Sn$ and a thin Sn coating is present on the sheath, from the Sn wetting in the crucible. The grains of $MgB_2$ within the core are shown. Due to the manufacturing method of the filaments, the $MgB_2$ grains are in close proximity to the material of the sheath: this distance is typically less than the coherence length of $Nb_3Sn$, enabling a persistent superconducting joint to be made between $MgB_2$ cores, through the $Nb_3Sn$ material of the sheath 2.

Figure 6:
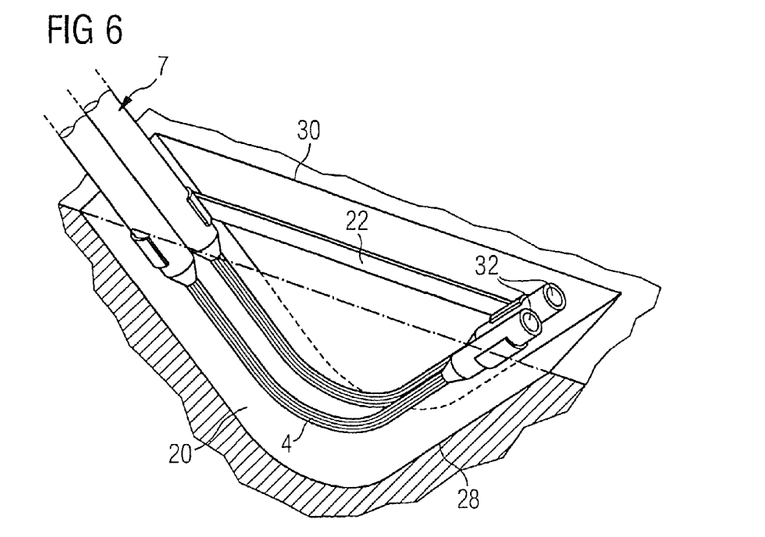
FIG. 6 shows the wires of FIGS. 2 and 3 at a later stage in the method of the exemplary embodiment.

FIG. 6 illustrates a further step in a method according to the present exemplary embodiment. The bent portions 20 of wires 7, now comprising $MgB_2$ cores in $Nb_3Sn$ sheaths, are placed within a further crucible or mould 28. Alternatively, the same crucible may be used, if of suitable construction. A superconducting casting material 30 such as Woods metal or PbBi is added to the crucible or mould 28, thereby immersing the bent portion 20 of filaments 4. To assist with mechanical alignment during casting, the retaining clip 22 may be left in place. To provide mechanical strength of the finished joint, adjacent parts of the wires 7 may also be cast into the casting material 30. The casting material is allowed to cool and harden. The resulting joint 40 is removed from the crucible or mould 28, as shown in FIG. 7.

It is important that the ends 32 of the filaments are not immersed in the etchant, or in the superconducting casting material to prevent damage to, or contamination of, the $MgB_2$ core.

Figure 7:
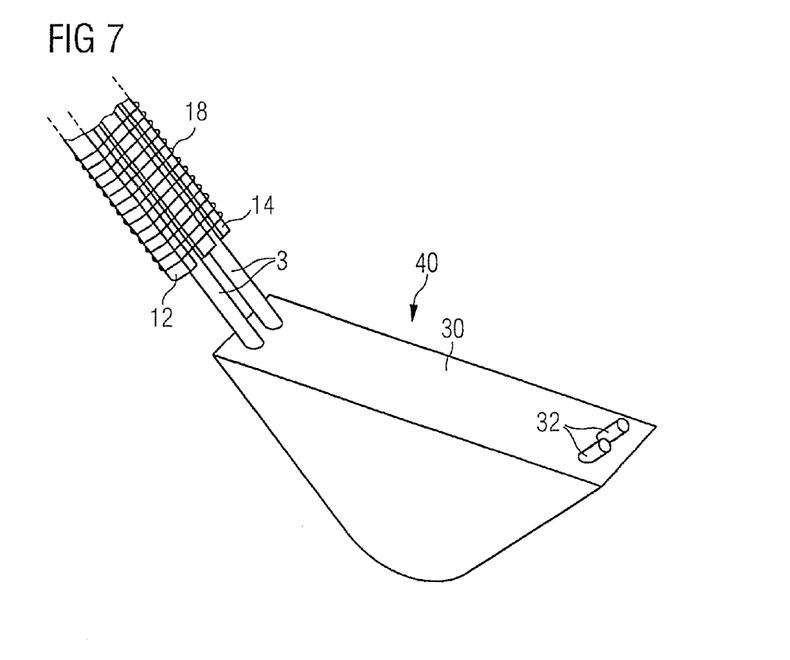
FIG. 7 shows a completed joint according to an exemplary embodiment of the present invention, following the step illustrated in FIG. 6.
Figure 8:
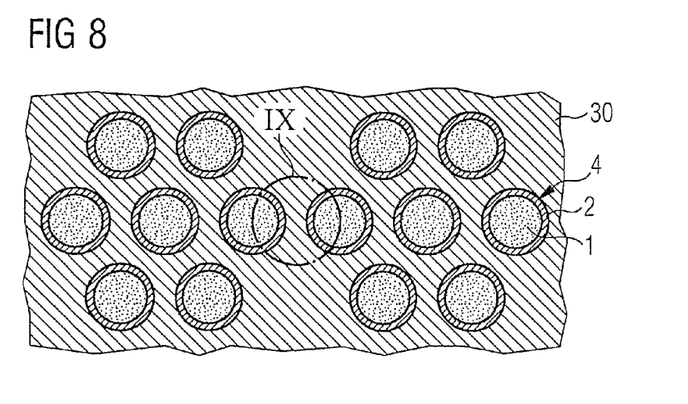
FIG. 8 shows a partial cross-section through a joint according to the exemplary embodiment, such as that illustrated in FIG. 7.
Figure 9:
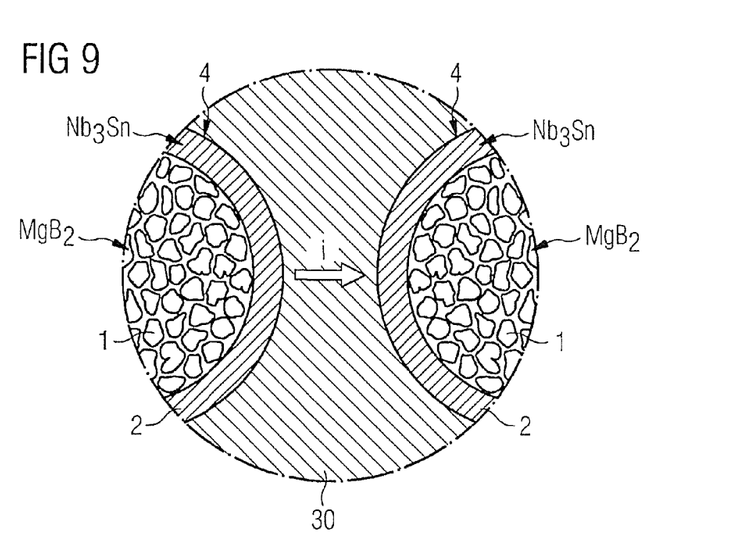
FIG. 9 shows an enlargement of the area identified as IX in FIG. 8.

FIG. 8 shows a cross-section through a part of the joint 40 illustrated in FIG. 7. Filaments 4 of each wire are shown, still grouped together. The filaments 4 are embedded within the superconducting casting material 30. FIG. 9 shows an enlargement of that part of FIG. 8 indicated at IX. The $MgB_2$ cores 1 of each filament are mechanically attached, and electrically connected together, through superconducting $Nb_3Sn$ sheath 2 layers and the superconducting casting material 30. The Sn coating shown in FIG. 5 has gone into solution in the superconducting casting material. An electric current i can pass from one core 1 of $MgB_2$, through a sheath 2 of $Nb_3Sn$, a distance of superconducting casting material 30, another sheath 2 of $Nb_3Sn$, to the $MgB_2$ core 1 of another filament 4. In this way, the superconducting joint of the exemplary embodiment may be realized. There is no need to apply a mechanical load to the superconducting wires, reducing the risk of damage to the superconducting filaments as compared to conventional joining methods which involve mechanical compression.

A variant of this method of forming a superconducting joint according to the exemplary embodiment will be discussed with reference to FIG. 10.

In this embodiment, it is not necessary to bend the wires, allowing a more compact final joint.

Figure 10:
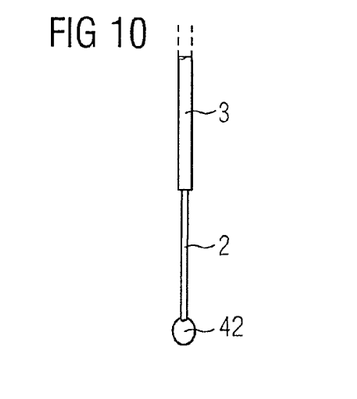
FIG. 10 shows a wire prepared for joining according to another exemplary embodiment of the present invention.

FIG. 10 shows an end of a first wire to be joined. The matrix material such as copper or MONEL 3 has been etched away, for example using acid, over an end portion, leaving Nb filaments in sheath 2 exposed. The ends 42 of the filaments are sealed before immersion in tin in the crucible. This may be achieved by welding or mechanical crimping of the matrix material.

During a crimping step, adjacent $MgB_2$ particles are crushed and fall from the filaments, leaving a length of empty sheath which may be sealed by crimping. Alternatively, welding, brazing or similar using a material which is unaffected by tin (Sn) at 600° C. may be used to seal the ends of the filaments. Such sealing has the objective of preventing the $MgB_2$ particles from coming into contact with the molten tin.

In the method of FIGS. 3-7, the bend in the wires is provided to prevent immersion of the open ends of the sheaths in the etchant, the tin and the superconducting casting material. By using straight wires with sealed ends, as shown in FIG. 10, the open ends of the sheaths are also protected from exposure to etchant or casting material. The crucible in which wires such as shown in FIG. 10 are cast into a joint may be much smaller than that shown in FIG. 7: for example, a narrow cylinder. A multi-part mould may be used to form moulding cavities for such joints, as crucibles may be difficult to form and fragile in use if shaped as a narrow cylinder.

Superconducting joints formed as described above are believed to be suitable for application in the manufacture of dry magnets cooled by a cryogenic refrigerator to a temperature of about 10K. In such an arrangement, it is preferred that the superconducting joints should be positioned close to the refrigerator, to ensure effective cooling of the joints.

An alternative method for forming superconducting joints will now be discussed, with reference to FIGS. 11 and 12. This method shares the feature of causing reaction of the niobium sheaths of the filaments with tin to form $Nb_3Sn$ superconducting sheaths. However, the resulting joint is crimped together, rather than being cast in a superconducting material.

Figure 11:
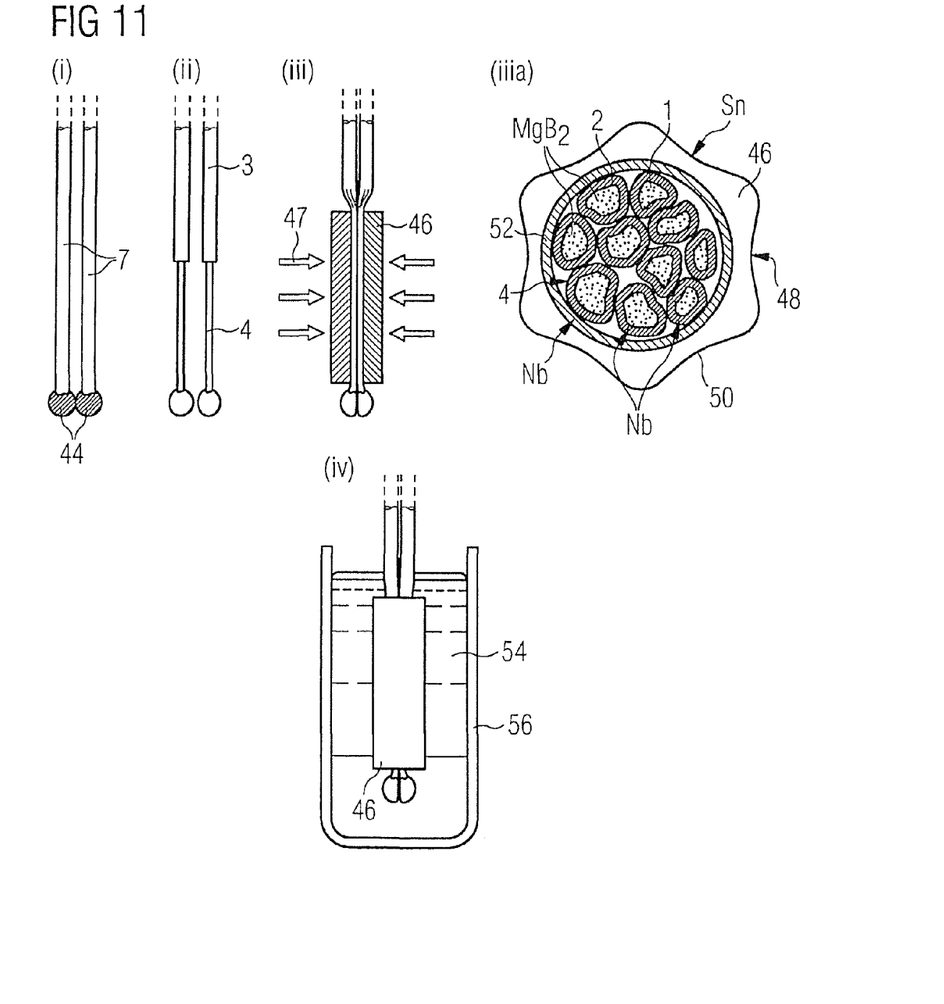
FIG. 11 illustrates various stages in a method of forming a superconducting joint according to an exemplary embodiment of the present invention.

FIG. 11(*i*) shows two wires 7 to be joined together according to a method of the present exemplary embodiment. The ends of the wires have been sealed at 44, for example by crimping, brazing or welding, with a material which is resistant to hot tin.

As shown in FIG. 11(*ii*), the matrices 3 are stripped over a certain length at their ends. The filaments 4 are thereby exposed. The material of the seals 44 must be resistant to any etchant used to strip the material of the sheath. The seals 44 prevent exposure of the $MgB_2$ cores to the etchant.

As illustrated in FIG. 11(*iii*), a cylindrical metal crimp 46, for example of niobium-lined copper tube is placed around the filaments. The niobium lining may be a coating on the inside of the copper crimp, or may be a niobium foil wrapped around the filaments, with a copper crimp then placed over the foil. The crimp should be a snug fit, but not tight, lest damage be caused to the filaments as the crimp is fitted. A mechanical crimping step is then performed, schematically illustrated by arrows 47. This presses the niobium lining of the crimp into contact with the niobium sheaths of the filaments, and presses the filaments into contact with each other. Although some mechanical compression of filaments 4 is involved, the $MgB_2$ cores 1 remain encased within the Nb sheaths 2, which reduces the risk of damage to the cores during mechanical compression, as compared to most conventional methods.

FIG. 11(iii)(a) shows a cross-section through the crimp at this stage. The outer surface 48 of the crimp shows mechanical deformations 50 due to the crimping process. The niobium lining 52 of the crimp 46 is to be seen. Within the crimp, the filaments 4 of the wires 7 are pressed together into mechanical contact. The crimping process must be controlled so as not to damage the $MgB_2$ cores of the filaments. At this stage, the $MgB_2$ cores 1 of the filaments 4 are electrically joined through niobium metal sheaths 2, and the niobium lining of the crimp.

FIG. 11(iv) shows a further stage in this method. The crimped filaments 4, as illustrated in FIGS. 11(iii) and 11(iii)(a) are immersed in molten tin 54 within a crucible 56. The molten tin is at a temperature of about 600° C. or more. This step may be performed in a vacuum, or in an inert atmosphere to prevent reaction of atmospheric components with the tin. As discussed with reference to FIG. 4, immersion of niobium sheaths 2 in such hot tin causes the niobium to react with the tin by diffusion to form superconducting niobium-tin ($Nb_3Sn$). Preferably, this reaction is performed at a suitable temperature, and for a suitable time, for the niobium sheaths 2 to completely transform to $Nb_3Sn$, but it is not necessary for the niobium lining 52 to completely transform to $Nb_3Sn$.

Figure 12:
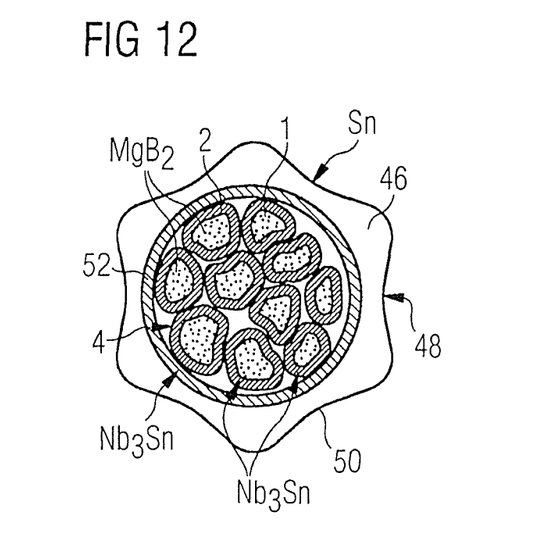
FIG. 12 shows a cross-section of a joint according to the exemplary embodiment as may be formed by the method illustrated in FIG. 11.

FIG. 12 shows a cross-section, similar to the cross-section of FIG. 11(iii)(a), of the resulting crimped joint. The outer surface 48 of the crimp shows mechanical deformations 50 due to the crimping process. The lining 52 of the crimp 46 has been converted to $Nb_3Sn$. Within the crimp, the sheaths 2 of filaments 4 of the wires 7 have also been converted to $Nb_3Sn$. They are pressed together into mechanical contact. The $MgB_2$ cores 1 of the filaments 4 are electrically joined through $Nb_3Sn$ sheaths, and the $Nb_3Sn$ lining of the crimp. The $Nb_3Sn$ components are superconducting, as discussed above, and have much better superconducting characteristics than niobium, for example in having a significantly greater field tolerance (about 18 T at a temperature of 4K) and a higher critical temperature (about 18K). $Nb_3Sn$ also has a relatively large coherence length. The copper crimp 46 is unaffected by immersion in tin, other than in gaining a tin coating.

While the resulting structure illustrated in FIG. 12 may be immersed in molten superconducting filler material such as Woods metal or PbBi, which infuses between the filaments 4 and fills the crimp, it is preferred not to include such jointing material. The mechanical and electrical contact between $Nb_3Sn$ sheaths and $Nb_3Sn$ crimp lining layer provided by this embodiment of the invention may be sufficient to provide the required superconducting joint. The resultant joint between multiple $Nb_3Sn$ connections without a filler material is expected to tolerate relatively high strength magnetic fields and remain superconducting at temperatures in excess of 10K. Such joints are expected to be useful in the manufacture of dry magnets cooled by thermal conduction by cryogenic refrigerators operating at about 10K.

The present exemplary embodiment accordingly provides methods for joining superconducting wires, and joints such as may be produced by such methods. The present exemplary embodiment relates to joints between filaments having a niobium sheath, such as superconducting wires having $MgB_2$ cores, those having NbTi cores, and joints between a $MgB_2$ cored wire and a NbTi cored wire. According to the exemplary embodiment, the niobium sheaths are immersed in hot tin (Sn) so as to convert the niobium into $Nb_3Sn$, which is a superior superconductor to elemental niobium. The resulting $Nb_3Sn$ sheaths act as an efficient and effective conductor for introducing transport current into the $MgB_2$ cored wires. Magnetic field tolerance of the resulting joint is significantly improved as compared to conventional joining methods for such wires, in which it is thought that the niobium sheath carries some or all of the current flowing through the joint. The $MgB_2$ core is not exposed to the tin (Sn) during joint formation, reducing the risk of contamination or oxidation of the $MgB_2$ core.

Some exposure of an $MgB_2$ core to hot tin may be tolerated, provided that the tin does not penetrate a significant distance into the wire so as to reach the effective part of the joint.

In some exemplary embodiments of the present invention, multiple joints may be formed in a single tin artifact. Each joint may be of two or more superconducting wires. In a variant of such embodiments, multiple joints may be formed in a single tin artifact, and the tin artifact may then be divided to provide separate joints.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

I claim as my invention:

1. A joint system, comprising:
first and second superconducting wires, each wire comprising a number of filaments which each comprise a superconductive core within a respective sheath, the filaments being embedded within a matrix, and the sheaths comprising elemental Nb;
a certain length of the filaments of each wire being exposed by removal of the matrix;
within the certain length, the sheaths are of $Nb_3Sn$ throughout their thickness, and adjacent to at least one end carrying current to the certain length and outside of said certain length the sheaths comprising said elemental Nb; and
within said certain length a superconductive path is formed between the superconductive cores of the filaments of the first wire through the respective $Nb_3Sn$ sheaths of the first wire to the superconductive cores of the filaments of the second wire through the respective $Nb_3Sn$ sheaths of the second wire.

2. The joint system according to claim 1 wherein the exposed certain length of the filaments of the first and the second wires are retained within a crimp, such that electrical and mechanical contact is provided between the $Nb_3Sn$ sheaths of the filaments.

3. The joint system according to claim 2 wherein the crimp is lined with Nb, at least partially converted into $Nb_3Sn$, providing a further superconductive path between the filaments.

4. The joint system according to claim 1 wherein the superconductive cores comprise $MgB_2$.

5. The joint system according to claim 1 wherein at least one end of the sheaths is sealed.

6. The joint system according to claim 1 wherein the filaments of the first and the second wires are embedded within a superconducting casting material such that the superconductive path between the superconductive cores of the filaments of the first wire through the $Nb_3Sn$ sheaths of the filaments to the cores of the second wire is provided through the superconducting casting material.

7. The joint system according to claim 1 wherein the sheaths comprise said elemental Nb adjacent to both opposite ends of and outside of said certain length.

* * * * *